US 6,733,165 B2

(12) United States Patent
Van Der Lei et al.

(10) Patent No.: US 6,733,165 B2
(45) Date of Patent: May 11, 2004

(54) OPTICAL INTEGRATOR FOR AN ILLUMINATION DEVICE

(75) Inventors: Sijbe Abraham Van Der Lei, Veldhoven (NL); Marnix Aldert Tas, Eindhoven (NL); Jan Hoegee, Eindhoven (NL); Paul Van Der Veen, Eindhoven (NL); Jess Koehler, Oberkochen (DE); Johannes Wangler, Koenigsbronn (DE)

(73) Assignee: Carl Zeiss Semiconductor Manufacturing Technologies AG, Oberkochen (DE)

( * ) Notice: Subject to any disclaimer, the term of this patent is extended or adjusted under 35 U.S.C. 154(b) by 0 days.

(21) Appl. No.: 10/022,866

(22) Filed: Dec. 20, 2001

(65) Prior Publication Data

US 2002/0126931 A1 Sep. 12, 2002

(30) Foreign Application Priority Data

Dec. 20, 2000 (DE) .......................... 100 65 198

(51) Int. Cl.⁷ .............................. F21V 7/04; G02B 6/00; G09F 13/00
(52) U.S. Cl. ...................... 362/551; 362/560; 362/556; 362/31; 385/146; 385/901
(58) Field of Search ................ 362/551, 553, 362/560, 556, 31, 554; 385/34, 901, 31, 146

(56) References Cited

U.S. PATENT DOCUMENTS 5,530,940 A * 6/1996 Ludwig, Jr. et al. .......... 385/31
5,835,661 A * 11/1998 Tai et al. .................... 385/146
5,937,127 A * 8/1999 Zarian et al. ................ 385/128
6,205,271 B1 * 3/2001 Bowron et al. ............... 385/31
6,285,443 B1 * 9/2001 Wangler et al. ............. 355/67

FOREIGN PATENT DOCUMENTS

| DE | 198 32 665 A1 | 1/2000 |
| EP | 0 747 772 A1 | 12/1996 |
| EP | 1 058 156 A2 | 12/2000 |
| EP | 1 170 635 A2 | 1/2002 |
| EP | 1 184 727 A1 | 3/2002 |
| JP | 07261292 | 10/1995 |
| JP | 09033705 A | 2/1997 |
| JP | 11162837 A | 6/1999 |
| WO | WO 91/04829 A1 | 4/1991 |
| WO | WO 99/32938 A2 | 7/1999 |

OTHER PUBLICATIONS

"Diaphragm at Quartz–Rod Entrance for I–Line Scanners", Research Disclosure No. 42343, Jul. 1999, p. 939, XP000888962.
Research Disclosure, (Anonymous), RD 43286, Apr. 2000, p. 704.

* cited by examiner

Primary Examiner—Stephen Husar
Assistant Examiner—Sharon Payne
(74) Attorney, Agent, or Firm—Sughrue Mion PLLC

(57) ABSTRACT

An optical integrator for an illumination device of a microlithographic projection exposure system has a rod made of a material transparent for ultraviolet light and with a rectangular cross-section. A rod arrangement with, for example, seven small rods made of the same material is arranged before the entrance surface of the rod. The aspect ratio between width and height of the small rods is the inverse of the aspect ratio between width and height of the rod. The rod arrangement, or some analogous structure, surface or treatment substituted therefor, serves to compensate the direction-dependent total reflection losses of the rod.

42 Claims, 3 Drawing Sheets

OPTICAL INTEGRATOR FOR AN ILLUMINATION DEVICE

The following disclosure is based on German Patent Application No. 100 65 198.4, filed on Dec. 20, 2000, which is incorporated into this application by reference.

BACKGROUND OF THE INVENTION

1. Field of the Invention

The invention relates to an optical integrator for an illumination device for a microlithographic projection exposure system, as well as an illumination device equipped with the optical integrator.

2. Description of the Related Art

The performance of projection exposure systems for the microlithographic production of semiconductor components is essentially determined by the imaging properties of the projection system. In addition, the image quality and the achievable wafer flow rate with a wafer stepper or wafer scanner are also essentially determined by the properties of the illumination device upstream of the projection system. This must be capable to provide as large a quantity of light as possible in the case of homogeneous distribution of intensity in a way that is precisely adjusted to the downstream optical system.

The adjustment to the subsequent system is also essentially determined by the telecentric alignment at the exit of the illumination device. A high degree of homogeneity of the illumination falling on the photo mask can be achieved by mixing the light coming from a light source in the illumination device with the aid of so-called optical integrators or light mixing elements. In addition to the optical integrators working with honeycomb condensers, those optical integrators with a rod, which consists of a material transparent for the light of a light source of the illumination device and, which is essentially penetrated by radiation in its longitudinal direction (z direction), have also gained acceptance. The rod is also described as a glass rod in the following, although it does not only consist of a glass-type material, for example synthetic quartz glass, but instead can also consist of a crystalline material, calcium fluoride for example. The rod has an entrance surface optically facing towards the light source of the illumination device, in which the light of the light source is incident, as well as an opposing exit surface, which can form an intermediate field plane of the illumination device.

As the cross-section form of the rod is intended to be adjusted to the form of the surface to be illuminated, the rod cross-section of the rods considered here is rectangular with an aspect ratio between width (or x direction) and height (or y direction) deviating from the value of 1. In the glass rod the light passing through is totally reflected many times on the lateral boundary surfaces, as in a kaleidoscope, which allows an almost perfect mixture of non-homogeneous parts of light to be achieved. Thus, the exit surface of the rod is reproduced as an almost uniform illuminated field on the photo mask. Illumination devices, which use that type of rectangular rod as an optical integrator, are disclosed for example in German Patent Applications DE 44 21 053, DE 195 20 563 or DE 199 12 464.

It has become known that the distribution of the light energy at the exit of such rod-shaped optical integrators exhibits an undesired asymmetry in the angular space. This asymmetry is described in the following as (energetic) ellipticity of the pupil and can be described for every image location or point (x, y) of the exit surface of the rod. The description of the ellipticity is based on the consideration that light energy is emitted via a specific angular distribution from every image location, i.e. not only in the z direction (equivalent to the longitudinal direction of the rod) but also with components diagonal to the z direction. Whereas the energy density for all directions should be identical within the angular distribution, in real systems a deviation from the symmetry i.e. a deformation of the distribution of energy is observed, in which the light intensity in areas at the distance from the x axis is lower than that in those areas that are just in the same distance from the y axis. This can lead to an undesired irregularity of the illumination at the wafer.

It is an object of the invention to provide an optical integrator of the type mentioned above, which in comparison with conventional optical integrators allows improved homogeneity of the illumination, in particular with regard to angle-dependent intensity inhomogeneities.

SUMMARY OF THE INVENTION

To resolve this problem, according to one formulation, the invention proposes an optical integrator for an illumination device for a microlithographic projection exposure system. The optical integrator includes:

- a rod made of a material transparent for the light of a light source;
- the rod having an entrance surface optically facing towards the light source and an opposing exit surface;
- the rod further having an essentially rectangular cross-section having a width and a height perpendicular to the width, an aspect ratio between the width and the height of the cross section deviating from unity; and
- the optical integrator having compensation means for compensating direction-dependent total reflection losses of the rod.

Another solution is an illumination device including such an optical integrator. Advantageous further embodiments are specified in the dependent claims. The verbatim of all claims is incorporated by reference into the subject matter of the description.

An optical integrator according to the invention is characterized in that compensation means are provided for the compensation of direction-dependent total reflection losses of the rod. This proposal is based on the knowledge that the reflection of light beams on the broad and narrow lateral surfaces of the glass rod is not total, but rather incomplete, even in the case of optimally prepared lateral surfaces. The cause of this can for example be a roughness of the reflecting surfaces, resulting in light beams no longer being situated locally in the angle range of the total reflection and part of the light intensity being uncoupled accordingly. It is also possible that in the area of the glass rod surfaces impurity atoms are embedded in the rod material, with the result that the refractive index at the edge of the rod does not correspond to that of the material in the interior. This can contribute to a partial uncoupling of the light. Absorption effects in the surface area can also reduce the intensity of the total reflected light.

As the glass rod in the case of the optical integrators considered here is rectangular due to its construction, the number of the reflections in the case of the passage of light on the lateral surfaces is perceptibly different. Light, the plane of reflection of which is essentially oriented parallel to the wider side of the rod and which is reflected on the narrow sides, is perceptibly less frequently reflected in the mean than light which is predominantly reflected in planes, which essentially run in the longitudinal direction of the rod parallel to or at an acute angle to the narrow sides of the rod, i.e. close to the y direction. Due to the incomplete total reflection in the case of real systems, intensity losses result at the rod exit, the amount of which is essentially dependent on the number of reflections during the passage of light, as well as on the degree of total reflection losses per reflection process. This results in higher losses in the angle range with large y values in the case of essentially identical surface properties of the wide and narrow sides than in the case of x values of the same magnitude. A compensation for these disadvantageous effects and, thus, a reduction of the ellipticity of the pupil, can be achieved with the aid of suitable compensation means, wherein the products, given by the number of reflections multiplied by the total reflection loss per reflection, in both the x direction and y direction are aligned with each other.

This can for example be achieved by targetedly reducing the specific total reflectance of the narrow lateral surfaces, at which fewer reflections occur, so that the total reflection losses per reflection increase, and an alignment is effected between the x and y direction. The specific total reflectance can for example be reduced by roughening the surface at the appropriate surface over a suitably long selected section in the z direction or in at least one partial area of a suitable size, by providing a reflectance reducing coating, flushing it with a gas, wetting it with a liquid and/or targetedly dosing or coating it with the refractive index altering substances. To this end at least one partial area of at least one rod lateral surface can have a suitable coating or a surface roughening, i.e. a targeted enlargement of the surface roughness relative to the adjacent smooth surface sections. At least one device can be provided to contact at least one partial area of one or more outer rod surfaces with a liquid or gaseous fluid that alters the reflectance in the contacted partial area, in particular reduces the total reflectivity. The device can for example be a gas flushing device or a wetting device. It is also possible, by taking suitable measures, to increase the number of reflections in the x direction running parallel to the wide rod side, wherein if necessary the specific total reflectance can remain unaltered at the lateral surfaces. A combination of these measures is also possible.

Via one or more of these measures it is possible to assign the rod at least one rectangular cross-section of a transparent compensation section of a suitable length in the z direction, which is formed in such a way that its total reflection losses in the direction of width (parallel to the x direction) are greater than those in the direction of height (parallel to the y direction) perpendicular to it. As this causes ratios to dominate in the compensation section, which are the exact inverse to those in the rod, with regard to the total reflection losses, a compensation of the energetic asymmetry is possible at the rod exit, wherein its amount can be influenced via the compensation section design.

Variants are preferred in which a compensation section is provided at the entrance area of the optical integrator, wherein the compensation section can preferably be arranged in the direction of the passage of light before the entrance surface of the rod. This results in a large rod length being available behind the compensation section, which allows a sufficiently thorough mixing of the light.

The compensation section can be formed in one piece with the glass rod, but is preferably achieved via a separate optical module. This renders it possible to modify already existing systems according to the invention without complicated interventions into the production and installation process of the glass rods. By interchanging compensation sections various compensation degrees can also be set, in order to adjust the integrator system on various illumination modus for example.

A preferred optical integrator is characterized in that at least one rod arrangement is arranged before the entrance surface of the rod, the rod arrangement comprising several small rods made of a material that is transparent for the light of the light source, wherein the small rods each preferably have a rectangular cross-section with an aspect ratio that is the inverse of the aspect ratio of the rod. Hereby an inverse aspect ratio is not necessarily defined by the inverse proportion of the aspect ratio but instead generally, so that the aspect ratio of the small rods is less than 1 if the aspect ratio of the rod is greater than 1 or vice versa. Via such a rod arrangement serving as a compensation section, in which the small rods are essentially arranged to advantageously fill the cross-section with regard to the entrance surface of the rod, the ellipticity explained above can be reduced to a tolerable degree or, if necessary, can be completely eliminated. By arranging a set of smaller rods before the glass rod, which are also rectangular, the long sides of which are however parallel to the short side of the rod, the difference in the number of reflections in the x direction and y direction is reduced. A change in the specific surface reflectance can be additionally determined via e.g. coating, surface roughening and/or wetting with a fluid, but is not required in principle.

A complete compensation of the total reflection losses is possible. Due to geometric considerations it would require, in the case of unaltered surface properties, a derivable large number of small rods and/or very thin rods and/or a large passage length of the compensation section. In practice, however, a partial compensation can suffice, so that compensation sections can be compactly produced and integrated into the installation environment of the illumination device with minimal effort. The compensation section, in particular the rod arrangement, preferably has a length 5% greater than that of the rod, wherein the length of the compensation section is preferably more than 10%, in particular between approx. 15% and 50% of the length of the rod. For expediency the number of small rods is greater than the aspect ratio of the rod cross-section and can, for example, be in the range between 3 and 15 and up to 20 rods. The height of the small rods can essentially be equivalent to that of the rod. From the technical production point of view it is advantageous if the small rods have identical cross-sections and lengths. However, in principle, deviating dimensions of the individual small rods are also possible. If necessary a better mixture of light can be achieved if the small rods have different dimensions. It is possible that the small rods are formed of small plates or foils, i.e. in particular of such transparent elements in which case the ratio between width and height can be more than 100 or even more than 1,000.

In embodiments in which, for example, a module is separately represented by a compensation section formed by a rod arrangement, this is expediently arranged in such a way that an insignificant space of, for example, less than one millimeter remains between the compensation section and the entrance surface of the rod. This prevents any contact with the sensitive surfaces of the glass rod and compensation section and thus possible damages to these surfaces.

In order to be able to use the largest possible parts of the rod cross-section for a passage of light, the rod arrangement expediently has a dense packing of small rods, wherein the small rods can be essentially arranged, however preferably without mutual contact, and separated from each other by lateral spacing, which can, for example, be in the range of less than 0.5 mm or 0.3 mm. A dense packing, in which the individual reflection surfaces of the small rods are still essentially free, can be guaranteed via suitable intermediately placed spacers, e.g. foils which expediently consist of a material by which the total reflection is not influenced in its respective support area at the adjacent small rods.

It usually suffices if the degree of reflectance of the surfaces facing towards each other between the small rods is greater than 50%, wherein at least 75% is particularly preferred. An almost complete total reflection is not necessary here. A dense packing with spacers simplifies the handling of the rod arrangement and guarantees a parallelism of the rods in the arrangement setting and in operation. At the same time the individual small rods are optically decoupled from each other in such that the total reflection is essentially maintained. By setting suitable degrees of reflectance between the small rods a desired degree of mixing can be set in the area of the rod arrangement.

These and other features result from the description and the drawings as well as from the claims, wherein each of the individual features can always be realized individually or together in the form of sub-combinations in an embodiment of the invention and in other fields and can represent advantageous, as well as protectable embodiments.

DETAILED DESCRIPTION OF THE PREFERRED EMBODIMENTS

Figure 1:
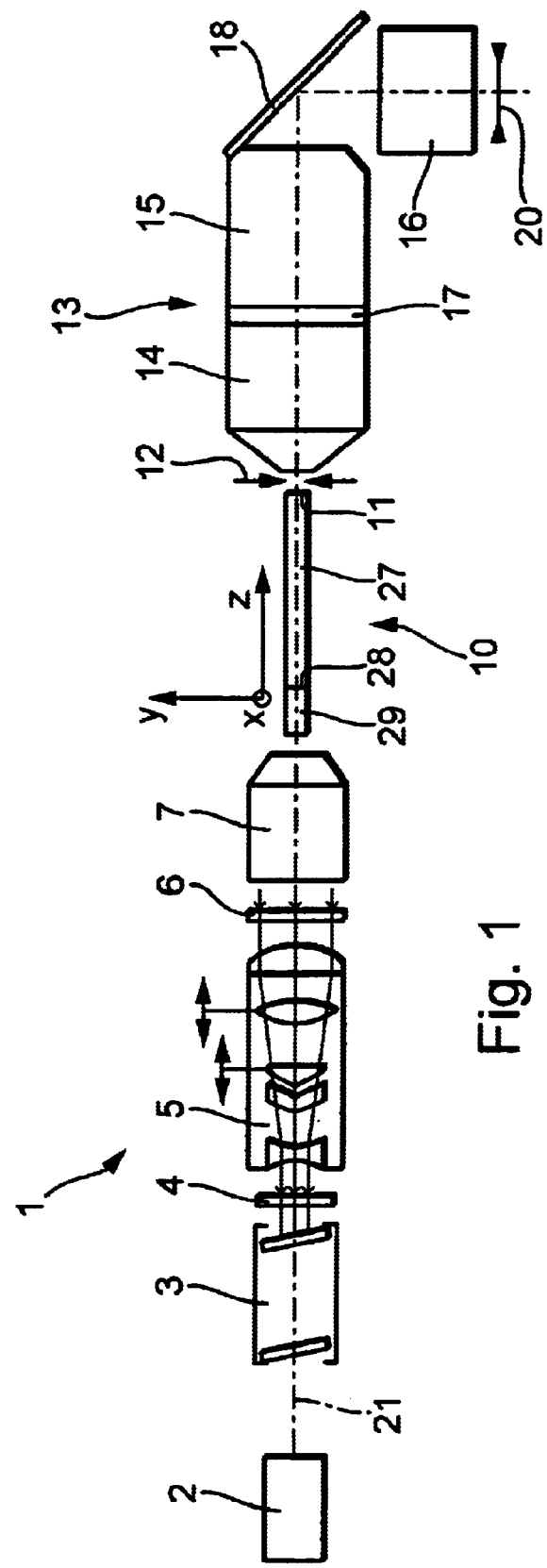
FIG. 1 is a schematic representation of a preferred embodiment of an illumination device according to the invention.

FIG. 1 an example of an illumination device 1 according to the invention, which is provided for installation in a projection exposure device for the microlithographic production of integrated circuits or other micro devices with resolutions of less than 1 μm. A laser 2 serves as a light source, for example an excimer laser commonly used in the deep ultra violet range (DUV), with a working wavelength of 248 nm, 193 nm or 157 nm. A beam widener 3 downstream of the laser serves to reduce coherence and beam formation on a rectangular beam cross-section with an aspect ratio x/y of its side length of approx. 3:1 for example. A first diffractive optical grid element 4 forms the object plane of a subsequent zoom objective 5, in the exit pupil of which a second optical grid element 6 is provided. From this the light enters into a coupling system 7, which transmits the light into an optical integrator. The light is mixed within the optical integrator (also described as a light mixing element) by multiple inner reflections, is homogenized, and exits at the exit surface 11 of the optical integrator essentially uniform. Directly at the exit surface 11 is an intermediate field plane in which a reticle masking system (REMA) 12, an adjustable field aperture is arranged. The subsequent objective 13 with several lens groups 14, 15, 16, pupil plane 17 and passive reflector 18 projects the intermediate field plane of the reticle masking system on the reticle or photo mask 20.

Together with a downstream projection objective (not shown) and an adjustable wafer holder this illumination system forms a projection exposure system for the microlithography of electronic components, but also of optically diffractive elements and other micro structured devices. More details on the structure and operating principle can be found in German Patent Application DE 195 20 563 A1, the contents of which are incorporated by reference into the contents of the present application.

In the case of a wafer stepper the entire structured surface equivalent to a chip, generally a rectangle with any aspect ratio between height and width of e.g. 1:1 to 1:2, is illuminated as uniform and sharply as possible on the reticle 20. In the case of a wafer scanner a narrow strip is illuminated on the reticle 20, a rectangle with a typical aspect ratio of 1:2 to 1:8 and the entire structured field of a chip is sequentially illuminated via scanning. Here too the illumination has to be extremely uniform and with sharp edges at least in the direction perpendicular to the scan direction.

In exceptional cases other forms of illuminated areas are also possible on the reticle 20. The opening of the reticle masking system 12 and the cross-section form of the optical integrator 10 are precisely adjusted to the required form. The rod-shaped optical integrator 10 of the example shown has a rectangular cross-section surface with edge lengths of 30.3 mm for the broadsides running parallel to the x direction and 9.7 mm for the narrow sides running perpendicular to it in the direction of height or in the y direction. The z direction running in the longitudinal direction of the optical integrator is parallel to the optical axis 21.

Figure 2:
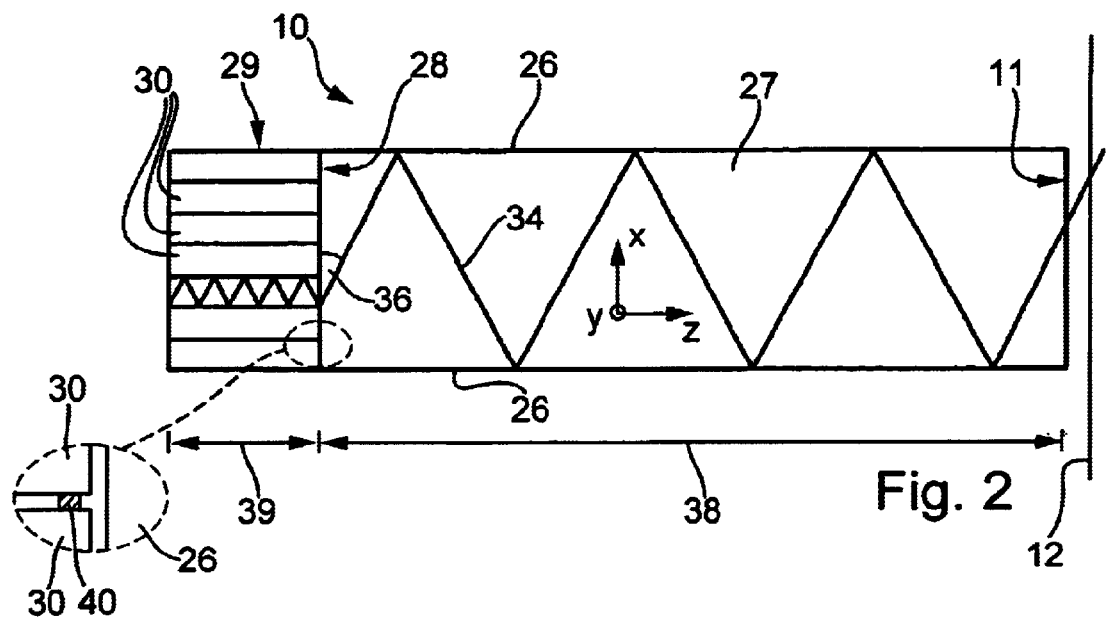
FIG. 2 is an top view of the broadside of an embodiment of an optical integrator according to the invention with schematic representation of reflections in the direction of width.
Figure 3:
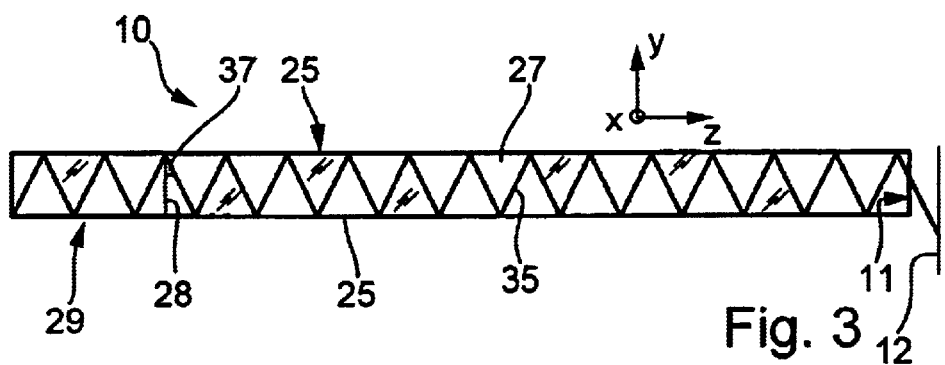
FIG. 3 is a side view of the optical integrator shown in FIG. 2 with reflections in the direction of height.

The structure of the rod-shaped optical integrator 10 is now explained in more detail with the aid of FIGS. 2 and 3. FIG. 2 shows a top view with a viewing direction along the y axis on a broadside 25 of the integrator system and FIG. 3 shows a top view of a narrow side 26 perpendicularly oriented towards the broadsides with a view in the x direction. The integrator system 10 essentially consists of a rectangular rod 27 in cross-section made of a material transparent for the light of the light source 2, for example of crystalline calcium fluoride, and a separate optical module in the form of a rod arrangement 29 arranged directly before the entrance surface 28, with seven essentially identical small rods 30, which are made of the same material as the rod 27 and each have rectangular identical cross-sections. In this, the overall cross-section of the rod arrangement 29 is equivalent to the cross-section of the rod 27, the measured heights of the small rods in the y direction are equivalent to the height of the rod 27 and the measured widths of the small rods 30 in the x direction are always equivalent to one seventh of the width of the rod 27. In the example the edge lengths of the rod 27 are approx. 30.3 mm in the x direction and approx. 9.7 mm in the y direction in the case of an overall length 38 of the rod 27 of approx. 550 mm. The small rods are always approx. 9.7 mm in height and approx. 4.3 mm wide in the x direction and have a length 39 of approx. 100 mm. In the case of the preferred arrangement of an uneven number of rods symmetrical to the optical axis 21 the small middle rod is situated on the optical axis.

Between the small rods 30 and the front side 28 of rod 27 facing towards them, a space of a few tenths of millimeters has been left, in order to avoid the contact leading to mechanical damages. Between the small rods spacers 40 are provided, which guarantee that the broadsides of the small rods 30 turned towards each other do not touch each other, wherein the lateral spacing of a few tenths of millimeters is such as small that the entire entrance surface 28 is essentially comprehensively filled by the small rods 30. The spacers 40 can for example be formed by suitable foils. All even outer surfaces of the rod 27 and the small rods 30 are planarized in such a way via suitable surface processing that light, which is incident at a suitable flat angle on the surfaces from the inside, is totally reflected with only minimal losses in intensity of 0.5% or less for example.

Figure 4:
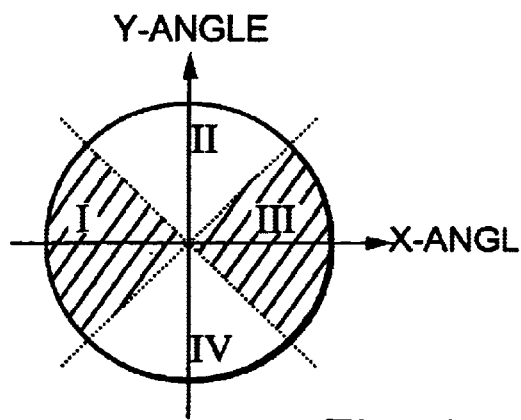
FIG. 4 is a schematic diagram to explain the definition of the energetic ellipticity at the exit surface of the optical integrator.
Figure 5:
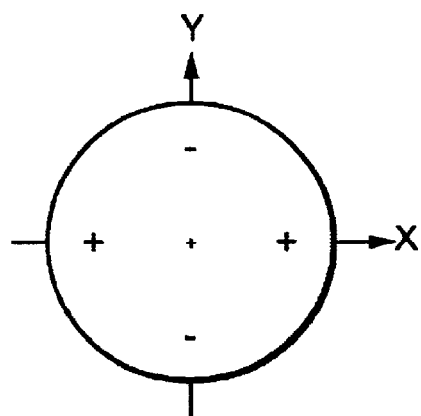
FIG. 5 is a schematic diagram of a distribution of ellipticity at the exit of a conventional rod-shaped optical integrator.

The distribution of light at exit 11 of the optical integrator in the area of the reticle masking system 12 can be characterized by various parameters, the values of which have an influence on the quality of the illumination process. Here the uniformity of the distribution of intensity, the telecentric alignment and the ellipticity are considered to be essential quantities, as shown by the distribution of light in the REMA plane 12. For the purpose of this registration the uniformity specifies the relative deviation of the energy density from a constant distribution via the reference surface 12. The ideal values are therefore close to the value of 0. Telecentric alignment here means the angle between the energetic center beam of the emitted light and the optical axis 21 (z axis). As a measure for the ellipticity E11 of the pupil, in accordance with the representation in FIG. 4, the ratio of the energies is used, which is available in the quadrants I+III arranged around the x axis or in the direction of width or in the quadrants II and IV arranged around the y axis or in the direction of height. Accordingly, with a distribution of energy in which more energy is available of the quadrants I and III, situated near to the x axis, than in the quadrants II and IV, situated near to the y axis, the value for the ellipticity would be greater than 1 or greater than 100%. This situation is schematically represented in FIG. 5, wherein the "−" symbols situated at the y axis symbolize a light intensity below that of the average value and the "+" symbols situated in the area of the x axis symbolize a light intensity above that of the average value.

Figure 6:
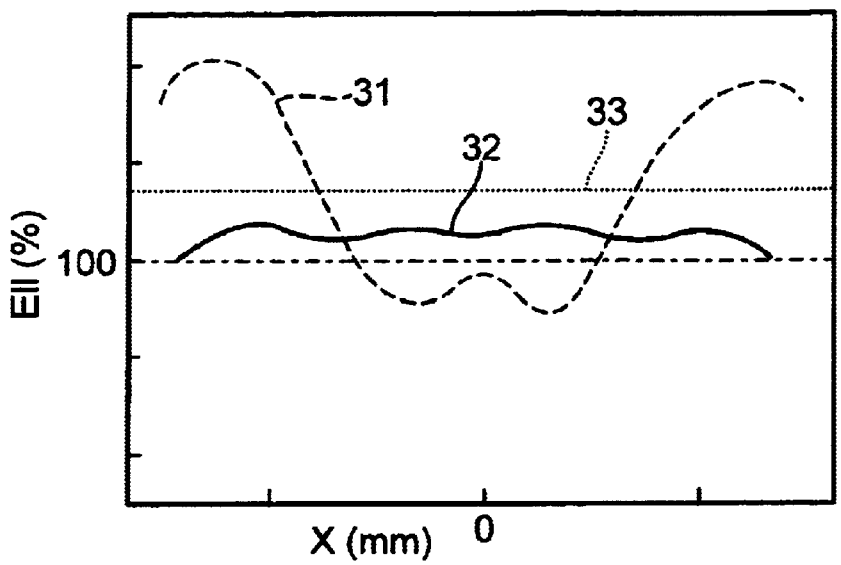
FIG. 6 is a diagram which shows the ellipticity of the pupil as a function of the location along the x direction for a conventional and an optical integrator according to the invention.

A corresponding representation of the ellipticity of the pupil in the REMA plane dependent on the x coordinates in this plane is shown in FIG. 6. The dashed curve 31 illustrated belongs to a conventional one-piece glass rod with rectangular cross-section. The dotted line 33 specifies the average value of curve 31. The continuous line 32, which is under the average value 33 for its entire width, symbolizes the ellipticity at the exit of a structured optical integrator according to the invention. This is explained in more detail in the following. In FIG. 6 it can be discerned with the aid of curve 31 that the ellipticity in the boundary area of the long side somewhat exceeds the ideal value of 100%, which corresponds to the "+" symbol in FIG. 3. In the example of the prior art shown the ellipticity in the center of the REMA plane 12 is less than the ideal value of 100%.

To explain the operating principle of the optical integrator 10 FIGS. 2 and 3 show schematically represented light beams 34, 35, wherein the light beam 34 penetrates into the integrator lens with an angle 36 and is essentially reflected parallel to the broadside 25 of the optical system on the narrow sides 26, whereas the light beam 35 penetrates with an angle 37 and is multiply totally reflected on the broadsides 25 of the optical system with a reflection plane running parallel to the y axis. The penetration angles 36, 37 measured with reference to the integration front surface 33 are not shown to scale, but are below the critical angle of the total reflection of the rod material. With the aid of the schematic representation it can be discerned that the reflected light in the x-z plane is only totally reflected six times over the length 38 of the rod, whereas that light reflected in the y-z axis plane (beam 35) perpendicular to it is reflected four times more on the same length. If it is assumed that in each reflection process at the reflection location, a low fraction of light intensity is removed from the total reflected light due to uncoupling and/or absorption, it can thus be discerned that the total reflection losses for reflected light close to the y axis is higher, in accordance with the larger number of reflections per passed length, than that in the x direction perpendicular to it. Accordingly in the case of a one-piece glass rod without upstream rod arrangement a qualitative distribution of exit intensity results in the angular space, which is similar to that shown in FIG. 5.

The resultant asymmetry or deformation of the exit pupil can be partially or completely compensated by placing the rod arrangement 29 upstream of the entrance surface 28 of the rod 27, wherein the degree of compensation can vary due to the suitable selection of number and dimension of the small rods. With the aid of FIGS. 2 and 3 it can be discerned that in the area of the rod arrangement 29 the ratios between number of reflections per unit of length are exactly inverted with regard to the x and y direction. Whereas via the length 39 of the small rods in the x direction (FIG. 2) ten reflections occur, over the same length in the y direction (FIG. 3) only four reflections occur. Assuming the same reflection losses per reflection at the surfaces, the total reflection losses at the exit of the rod arrangement are greater in the x direction than in the y direction. Thus—with reference to the x and y directions—exactly inverted ratios exist to those at the exit of a one-piece rod with the same cross-section form. Thus, the placing upstream of a rod arrangement 29 of the type represented allows a partial or complete compensation of the deformation of the ellipticity of the exit pupil caused by a one-piece glass rod to be achieved.

The degree of compensation depends mainly on the number of small rods or their size in the x direction and/or on the length of the small rods. The principle allows, if necessary, a complete compensation, wherein in many cases a partial compensation can however be sufficient. In the example shown the ratio of the number of reflections in the x and y direction can be reduced by approx. 30% in comparison with a one-piece glass rod.

The continuous line 32 in FIG. 6 clarifies the compensatory effect via the width (in the x direction) of the REMA plane 12 for the explained example. It can be discerned that the profile of the pupil ellipticity essentially differs in two points from the profile, which arises itself without compensation means. For one thing, the profile has become smoother. Above all, however, the deviation of the curve from the ideal value (100%), in comparison with the uncompensated integrator system (curve 31), has been perceptibly reduced and lower maximum deviations occur, above all in the outer areas of the rod.

It can be discerned that due to the provision of compensation means according to the invention before the entrance of light into a one-piece glass rod 27 it is possible to compensate a considerable part of the ellipticity, which is the result of the finite reflectance of the glass rod outer surfaces and is independent of the location of the rod exit surface. In addition, it has been shown that via the rod arrangement 30 serving as a compensation device the field profile of the ellipticity, i.e. its dependency of the location at the rod exit, can be altered in moderation and, in fact, independent of its cause. In the case of uncompensated glass rods the existing curvature of the profile (curve 31 in FIG. 6) is reduced and, if necessary, even over compensated. This provides the possibility of setting a profile of minimal ellipticity for a given illumination setting. Generally, compensation means of the type described here are also considered as setting means for the energetic pupil ellipticity and/or for the field profile of the ellipticity, with the aid of which the ellipticity can be set to a desired, and if necessary asymmetrical, profile. It has been shown that neither the uniformity nor the telecentric alignment of the distribution of intensity in the REMA plane 12 are significantly altered.

Alternatively, or in addition to the described arrangement, one or more optical integrators according to the invention can also be provided at another position within an illumination system, for example between light source 2 and zoom objective 3.

The above exemplary representation of numeric values and trends refers to an illumination in the case of a conventional setting of the illumination device with a set coherence degree of σ=0.26. In this σ specifies the ratio between the numerical aperture on the side of the image of the illumination system 1 and the numerical aperture on the side of the object of the succeeding objective. Whereas the relative improvements of the reflection losses caused by ellipticity are similar for various illumination settings, the same does not apply to the compensation of the field profile. Thus, it can be advantageous if devices are provided, which, depending on the illumination setting, influence the structure and/or the arrangement of a compensation section in such a way that the desired positive effect on the ellipticity profile is achieved.

Figure 7:
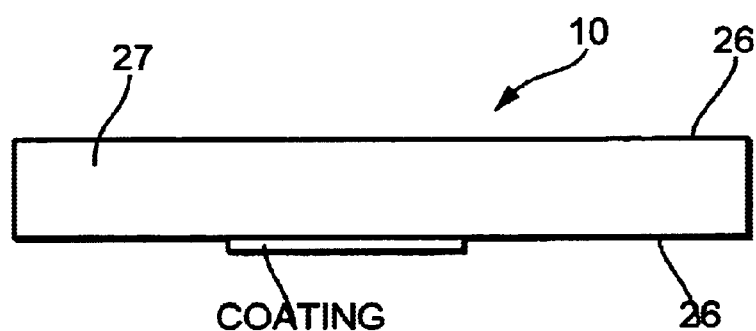
FIG. 7 is an exemplary embodiment of an optical integrator having a coating on one of its lateral surfaces.

FIG. 7 shows an exemplary embodiment of the optical integrator 10, in which a coating is applied on the narrow side 26 of the rod 27. Therein, the coating is formed in such a way that differences in the total reflection losses between the direction of the width of the rod 27 and the direction of the height of the rod 27 are at least partially compensated.

Figure 8:
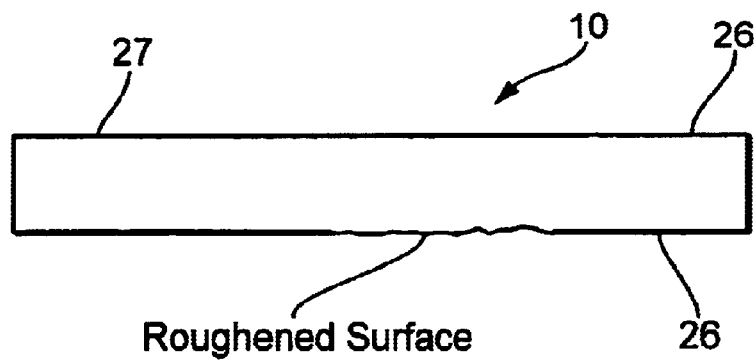
FIG. 8 is an exemplary embodiment of an optical integrator having a roughened surface on one of its lateral surfaces.

FIG. 8 shows an exemplary embodiment of the optical integrator 10, in which the rod 27 has a surface roughening a partial area of the narrow side 26 of the rod 27. Therein, the roughening surface is formed in such a way that differences in the total reflection losses between the direction of the width of the rod 27 and the direction of the height of the rod 27 are at least partially compensated.

Figure 9:
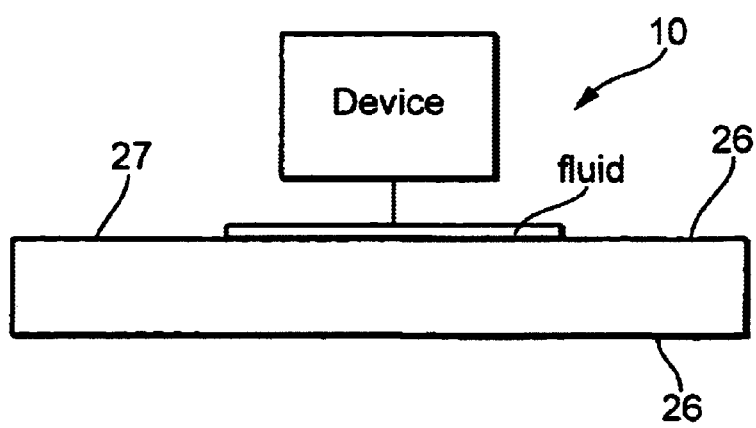
FIG. 9 is an exemplary embodiment of an optical integrator having a fluid on one of its lateral surfaces applied by a device contacting the optical integrator.

Finally, FIG. 9 shows an exemplary embodiment of the optical integrator 10, wherein a device contacts a partial area of the narrow side 26 of the rod 27 so that a fluid is applied thereon that alters the reflectivity of the partial area contacted by the fluid.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. An optical integrator for an illumination device for a microlithographic projection exposure system, the optical integrator comprising:
   a rod made of a material transparent to the light of a light source;
      the rod comprising an entrance surface optically facing towards the light source and an opposing exit surface;
      the rod further comprising an essentially rectangular cross section having a width and a height perpendicular to the width, an aspect ratio between the width and the height of the cross section deviating from unity; and
   compensation means for compensating direction-dependent total reflection losses of the rod;
   wherein the compensation means includes at least one transparent compensation section having a second, rectangular cross section, the cross section having a second width and a second height perpendicular to the second width, wherein the second width is larger than the second height, the compensation section being formed in such a way that total reflection losses in the compensation section are greater in the direction of the width of the rod than in the direction of the height of the rod.

2. An optical integrator according to claim 1, wherein the compensation section is associated with an entrance area of the optical integrator.

3. An optical integrator according to claim 1, wherein the compensation section is configured to compensate for direction-dependent total reflection losses of the rod, the compensation section being arranged before the entrance surface of the rod in the direction of the passage of the light.

4. An optical integrator according to claim 1, wherein the compensation section comprises an optical module separate from the rod.

5. An optical integrator according to claim 1, wherein the compensation means comprises at least one coating of a partial area of at least one lateral surface of the rod, wherein the coating is formed in such a way that differences in the total reflection losses between the direction of width and the direction of height are at least partially compensated.

6. An optical integrator according to claim 1, wherein the compensation means comprises at least one surface roughening of a partial area of at least one lateral surface of the rod, wherein the surface roughening is formed in such a way that differences in the total reflection losses between the direction of width and the direction of height are at least partially compensated.

7. An optical integrator according to claim 1, wherein the compensation means comprises at least one device for contacting at least one partial area of at least one lateral surface of the rod with fluid adapted to alter the reflectivity of the partial area contacted by the fluid.

8. An optical integrator according to claim 1, wherein the compensation means comprises at least one rod arrangement arranged before the entrance surface of the rod, the rod arrangement comprising a plurality of smaller rods made of a material that is transparent for the light of the light source.

9. An optical integrator according to claim 8, wherein the smaller rods each have a third, rectangular cross section with a second aspect ratio between a third width and a third height, the second aspect ratio being the inverse of the aspect ratio of the rod.

10. An optical integrator according to claim 1, wherein the compensation section has a length between 5% and 50% of the length of the rod.

11. An optical integrator according to claim 8, wherein the number of smaller rods of the rod arrangement is greater than the aspect ratio of the cross section of the rod.

12. An optical integrator according to claim 8, wherein the smaller rods are formed by one of plates and foils.

13. An optical integrator according to claim 1, wherein the compensation section comprises a separate optical module arranged before the entrance surface of the rod in such a way that a space remains between the compensation section and the entrance surface of the rod.

14. An optical integrator according to claim 8, wherein a number of the smaller rods is arranged in a packing, wherein the smaller rods are essentially arranged without mutual contact and separated from each other by means of spacers to provide lateral spacing between adjacent smaller rods.

15. An optical integrator according to claim 1, wherein the compensation section has an optical axis and interior surfaces extending in the direction of the optical axis, wherein the interior surfaces are formed in such a way that there is no total reflection on the interior surfaces, the interior surfaces providing reflectance greater than approximately 50% and less than at least one of 80% and 100%.

16. An optical integrator according to claim 1, wherein the compensation means is designed as reducing means for reducing a field profile of a pupil ellipticity.

17. An optical integrator according to claim 1, wherein the compensation section for compensating direction-dependent total reflection losses of the rod comprises an optical module separate from the rod and arranged before the entrance surface of the rod in the direction of the passage of the light.

18. An optical integrator for an illumination device for a microlithographic projection exposure system, the optical integrator comprising:
a rod made of a material transparent to the light of a light source;
the rod comprising an entrance surface optically facing towards the light source and an opposing exit surface;
the rod further comprising an essentially rectangular cross section having a width and a height perpendicular to the width, an aspect ratio between the width and the height of the cross section deviating from unity; and
compensation means for compensating direction-dependent total reflection losses of the rod;
the compensation means comprising at least one rod arrangement arranged before the entrance surface of the rod, the rod arrangement comprising a plurality of smaller rods made of a material that is transparent to the light of the light source.

19. An optical integrator according to claim 18, wherein a number of the smaller rods are arranged in a packing, wherein the smaller rods are essentially arranged without mutual contact and separated from each other by means of spacers to provide lateral spacing between adjacent smaller rods.

20. An optical integrator according to claim 18, wherein the smaller rods each have a rectangular cross section with a second aspect ratio between a second width and a second height, the second aspect ratio being the inverse of the aspect ratio of the rod.

21. An illumination device for a microlithographic projection exposure system, comprising:
a light source;
optical elements for influencing the light of the light source, the optical elements including at least one optical integrator, the optical integrator comprising:
a rod made of a material transparent to the light of the light source;
the rod comprising an entrance surface optically facing towards the light source and an opposing exit surface;
the rod further comprising an essentially rectangular cross section having a width and a height perpendicular to the width, an aspect ratio between the width and the height of the cross section deviating from unity;
the optical integrator further comprising compensation means for compensating direction-dependent total reflection losses of the rod;
the compensation means comprising at least one rod arrangement arranged before the entrance surface of the rod, the rod arrangement comprising a plurality of smaller rods made of a material that is transparent to the light of the light source.

22. A microlithographic projection exposure system comprising an illumination device and projection optical system, the illumination device being designed according to claim 21.

23. An optical integrator comprising:
a rod transparent to the light of a light source and having an entrance surface and an opposing exit surface for the light, wherein the rod has an essentially rectangular cross section having a width and a height, and wherein an aspect ratio between the width and the height of the cross section is greater to or less than one; and
a supplement to the rod that compensates direction-dependent total reflection losses of the rod, the supplement being a separate optical module made of transparent material having surfaces arranged to reflect light transmitted by the optical module and built in such a way that reflection losses in the optical module are greater in the direction of the width of the rod than in the direction of the height of the rod.

24. An optical integrator according to claim 18, wherein the rod arrangement has a length between 5% and 50% of the length of the rod.

25. An optical integrator according to claim 18, wherein the number of smaller rods of the rod arrangement is greater than the aspect ratio of the cross section of the rod.

26. An optical integrator according to claim 18, wherein the smaller rods are formed by one of plates and foils.

27. An optical integrator according to claim 18, wherein the rod arrangement comprises a separate optical module arranged before the entrance surface of the rod in such a way that a space remains between the separate optical module and the entrance surface of the rod.

28. An optical integrator according to claim 18, wherein the rod arrangement has an optical axis and interior surfaces extending in the direction of the optical axis, wherein the interior surfaces are formed in such a way that there is no total reflection on the interior surfaces, the interior surfaces providing reflectance greater than approximately 50% and less than at least one of 80% and 100%.

29. An optical integrator for an illumination device for a microlithographic projection exposure system, the optical integrator comprising:
a rod made of a material transparent to the light of a light source;
the rod comprising an entrance surface optically facing towards the light source and an opposing exit surface;
the rod further comprising an essentially rectangular cross section having a width and a height perpendicular to the width, an aspect ratio between the width and the height of the cross section deviating from unity; and compensation means for compensating direction-dependent total reflection losses of the rod;

wherein the compensation means comprises at least one reflectance reducing optical coating of a partial area of at least one lateral surface of the rod, wherein the coating is formed in such a way that differences in the total reflection losses between the direction of width and the direction of height are at least partially compensated.

30. An optical integrator according to claim 29, wherein the compensation means includes a compensation section that is associated with an entrance area of the optical integrator.

31. An optical integrator according to claim 29, wherein the compensation means includes a compensation section having a length between 5% and 50% of the length of the rod.

32. An optical integrator for an illumination device for a microlithographic projection exposure system, the optical integrator comprising:

a rod made of a material transparent to the light of a light source;

the rod comprising an entrance surface optically facing towards the light source and an opposing exit surface;

the rod further comprising an essentially rectangular cross section having a width and a height perpendicular to the width, an aspect ratio between the width and the height of the cross section deviating from unity; and compensation means for compensating direction-dependent total reflection losses of the rod;

wherein the compensation means comprises at least one surface roughening of a partial area of at least one lateral surface of the rod, wherein the surface roughening is formed in such a way that differences in the total reflection losses between the direction of width and the direction of height are at least partially compensated.

33. An optical integrator according to claim 32, wherein the compensation means includes a compensation section that is associated with an entrance area of the optical integrator.

34. An optical integrator according to claim 32, wherein the compensation means includes a compensation section having a length between 5% and 50% of the length of the rod.

35. An illumination device comprising an optical integrator according to claim 1.

36. A microlithographic projection exposure system comprising an illumination device and projection optical system, the illumination device being designed according to claim 35.

37. An illumination device comprising an optical integrator according to claim 20.

38. A microlithographic projection exposure system comprising an illumination device and projection optical system, the illumination device being designed according to claim 37.

39. An illumination device comprising an optical integrator according to claim 29.

40. A microlithographic projection exposure system comprising an illumination device and projection optical system, the illumination device being designed according to claim 39.

41. An illumination device comprising an optical integrator according to claim 32.

42. A microlithographic projection exposure system comprising an illumination device and projection optical system, the illumination device being designed according to claim 41.

* * * * *